(12) United States Patent
Kwok et al.

(10) Patent No.: US 9,337,337 B2
(45) Date of Patent: May 10, 2016

(54) MOS DEVICE HAVING SOURCE AND DRAIN REGIONS WITH EMBEDDED GERMANIUM-CONTAINING DIFFUSION BARRIER

(71) Applicant: Taiwan Semiconductor Manufacturing Company, Ltd., Hsin-Chu (TW)

(72) Inventors: Tsz-Mei Kwok, Hsin-Chu (TW); Kun-Mu Li, Zhudong Township (TW); Hsueh-Chang Sung, Khubei (TW); Chii-Horng Li, Zhubei (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/968,751

(22) Filed: Aug. 16, 2013

(65) Prior Publication Data

US 2015/0048417 A1 Feb. 19, 2015

(51) Int. Cl.
*H01L 29/66* (2006.01)
*H01L 29/78* (2006.01)

(52) U.S. Cl.
CPC ...... *H01L 29/7847* (2013.01); *H01L 29/66636* (2013.01); *H01L 29/66545* (2013.01); *H01L 29/66628* (2013.01)

(58) Field of Classification Search
CPC .............. H01L 29/0847; H01L 29/165; H01L 29/66636; H01L 29/7834; H01L 29/7848
USPC ........... 257/327, E21.431, E29.039, E29.242, 257/E29.255, E29.266, E29.297, E29.298
See application file for complete search history.

(56) References Cited

U.S. PATENT DOCUMENTS

| | | | |
|---|---|---|---|
| 7,943,969 B2 * | 5/2011 | Yang et al. | 257/219 |
| 8,815,713 B2 * | 8/2014 | Sung et al. | 438/478 |
| 2003/0017667 A1 | 1/2003 | Park et al. | |
| 2007/0235802 A1 * | 10/2007 | Chong et al. | 257/346 |
| 2009/0108308 A1 | 4/2009 | Yang et al. | |
| 2012/0181625 A1 * | 7/2012 | Kwok et al. | 257/408 |
| 2013/0207166 A1 * | 8/2013 | Chen et al. | 257/288 |
| 2015/0021688 A1 * | 1/2015 | Sung et al. | 257/344 |
| 2015/0021696 A1 * | 1/2015 | Sung et al. | 257/368 |
| 2015/0041852 A1 * | 2/2015 | Kwok et al. | 257/190 |

* cited by examiner

*Primary Examiner* — Anh Mai
(74) *Attorney, Agent, or Firm* — Slater Matsil, LLP

(57) ABSTRACT

An integrated circuit structure includes a gate stack over a semiconductor substrate, and an opening extending into the semiconductor substrate, wherein the opening is adjacent to the gate stack. A first silicon germanium region is in the opening, wherein the first silicon germanium region has a first germanium percentage. A second silicon germanium region is over the first silicon germanium region, wherein the second silicon germanium region has a second germanium percentage higher than the first germanium percentage. A third silicon germanium region is over the second silicon germanium region, wherein the third silicon germanium region has a third germanium percentage lower than the second germanium percentage.

19 Claims, 12 Drawing Sheets

MOS DEVICE HAVING SOURCE AND DRAIN REGIONS WITH EMBEDDED GERMANIUM-CONTAINING DIFFUSION BARRIER

BACKGROUND

Metal-Oxide Semiconductor (MOS) devices are key components of integrated circuits. The performance of MOS devices affects the performance of the entire integrated circuits in which the MOS devices are located. Therefore, methods for improving the performance of the MOS devices have been studied.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Reduction in the size and the inherent features of semiconductor devices (e.g., Metal-Oxide Semiconductor (MOS) devices) has enabled continued improvement in speed, performance, density, and cost per unit function of integrated circuits over the past few decades. In accordance with a design of the MOS devices and one of the inherent characteristics thereof, modulating the length of a channel region underlying a gate between a source and drain of a MOS device alters a resistance associated with the channel region, thereby affecting a performance of the MOS device. More specifically, shortening the length of the channel region reduces a source-to-drain resistance of the MOS device, which, assuming other parameters are maintained relatively constant, may allow an increase in the current flow between the source and drain when a sufficient voltage is applied to the gate of the MOS device.

To further enhance the performance of MOS devices, stress may be introduced into the channel region of a MOS device to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

An available method for applying compressive stresses to the channel regions of PMOS devices is growing SiGe stressors in the source and drain regions. Such a method typically includes the steps of forming a gate stack on a semiconductor substrate, forming spacers on sidewalls of the gate stack, forming recesses in the silicon substrate along the gate spacers, and epitaxially growing SiGe stressors in the recesses. The epitaxy SiGe stressors apply a compressive stress to the channel region, which is located between a source SiGe stressor and a drain SiGe stressor.

A process for forming a Metal-Oxide-Semiconductor (MOS) device with stressors is provided in accordance with various exemplary embodiments. The intermediate stages of forming the MOS device are illustrated. The variations of the embodiments are discussed. Throughout the various views and illustrative embodiments, like reference numbers are used to designate like elements.

Figure 1:
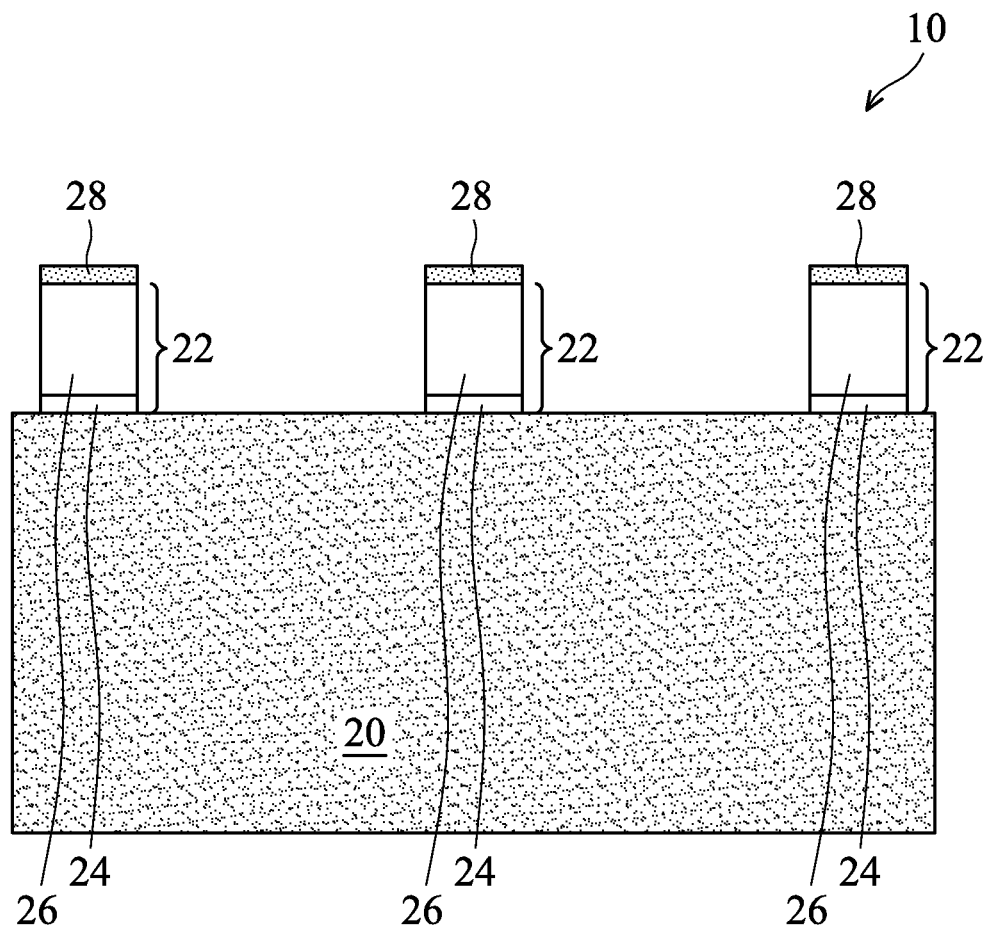
FIGS. 1 through 11 are cross-sectional views of intermediate stages in the manufacturing of a Metal-Oxide Semiconductor (MOS) device in accordance with some exemplary embodiments.

FIG. 1 illustrates substrate 20, which is a portion of wafer 10. Substrate 20 may be a bulk semiconductor substrate such as a silicon substrate, or may have a composite structure such as a Silicon-On-Insulator (SOI) structure. Alternatively, other semiconductor materials that include group III, group IV, and/or group V elements may also be comprised in substrate 20, which semiconductor materials may include silicon germanium, silicon carbon, and/or III-V compound semiconductor materials.

Gate stacks 22 are formed over substrate 20, and include gate dielectrics 24 and gate electrodes 26. Gate dielectrics 24 may comprise silicon oxide and/or a high-k material having a high k value, for example, higher than about 7. Gate electrodes 26 may include commonly used conductive materials such as doped polysilicon, metals, metal silicides, metal nitrides, and combinations thereof. Gate stacks 22 may also include hard masks 28, which may comprise silicon nitride, for example, although other materials such as silicon carbide, silicon oxynitride, and the like may also be used. In the embodiments in which replacement gates are formed, hard mask 28 may be, or may not be, formed.

Figure 2:
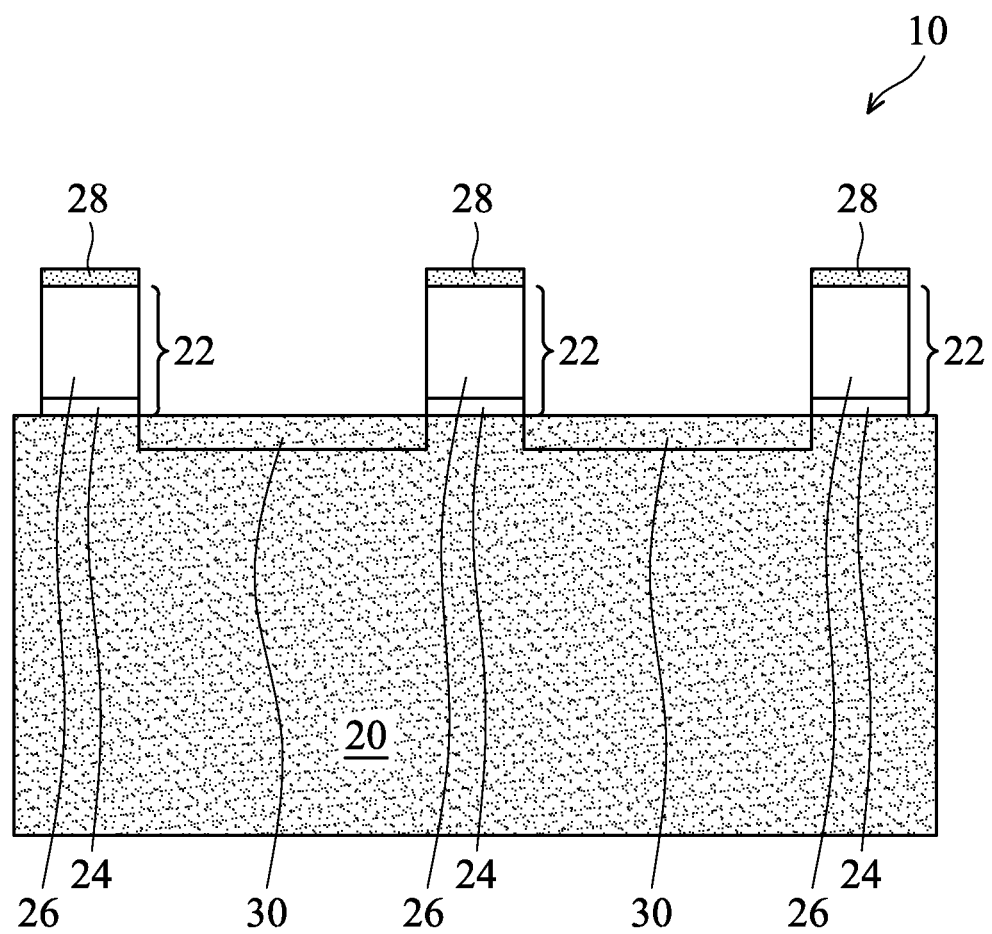

As shown in FIG. 2, Lightly Doped Drain/source (LDD) regions 30 are formed, for example, by implanting a p-type impurity such as boron and/or indium into substrate 20. Gate stacks 22 and hard masks 28 act as implantation masks so that the inner edges of LDD regions 30 are substantially aligned with the edges of gate stacks 22, respectively. The LDD implantation may be performed using energies in a range between about 1 keV and about 10 keV, and a dosage in a range between about $1\times10^{13}/cm^2$ and about $1\times10^{16}/cm^2$. It is appreciated, however, that the values recited throughout the description are merely examples, and may be changed to different values. The LDD implantation may be tilted or vertical, with the tilt angle in a range between about 0 degree and about 30 degrees. In addition, pocket regions 32 may also be formed, for example, by implanting an n-type impurity such as arsenic, phosphorous, or the like into substrate 20. The pocket implantation may be tilted, with the tilt angle greater than the tilt angle of the LDD implantation. In some embodiments, the tilt angle of the pocket implantation is in a range between about 15 degree and about 45 degrees. For clarity, pocket regions 32 are not illustrated in subsequent drawings.

Figure 3:
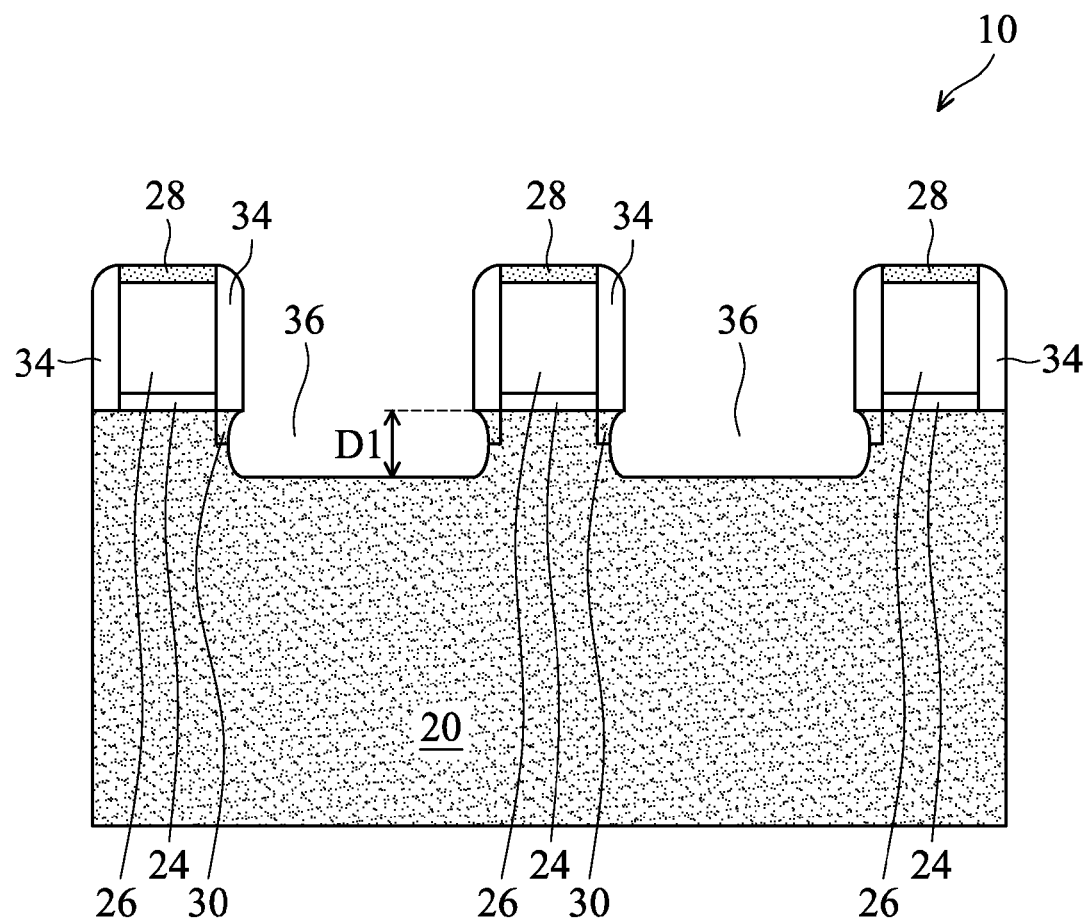

Referring to FIG. 3, gate spacers 34 are formed on the sidewalls of gate dielectrics 24 and gate electrodes 26. In some embodiments, each of gate spacers 34 includes a silicon oxide layer (not shown) and a silicon nitride layer over the silicon oxide layer, wherein the silicon oxide layer may have a thickness in a range between about 15 Å and about 50 Å, and the thickness of the silicon nitride layer may be in a range between about 50 Å and about 200 Å. In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

As also shown in FIG. 3, in accordance with some embodiments, an isotropic etch may be performed to form openings 36 in substrate 20. The isotropic etch may be a dry etch, wherein the etching gas may be selected from $CF_4$, $Cl_2$, $NF_3$, $SF_6$, and combinations thereof. Depth D1 of opening 36 may be in a range between about 150 Å and about 500 Å, for example. In alternative embodiments, the isotropic etch step in FIG. 3 is skipped, and the step in FIG. 4 is performed to form openings 36 as shown in FIG. 4.

Figure 4:
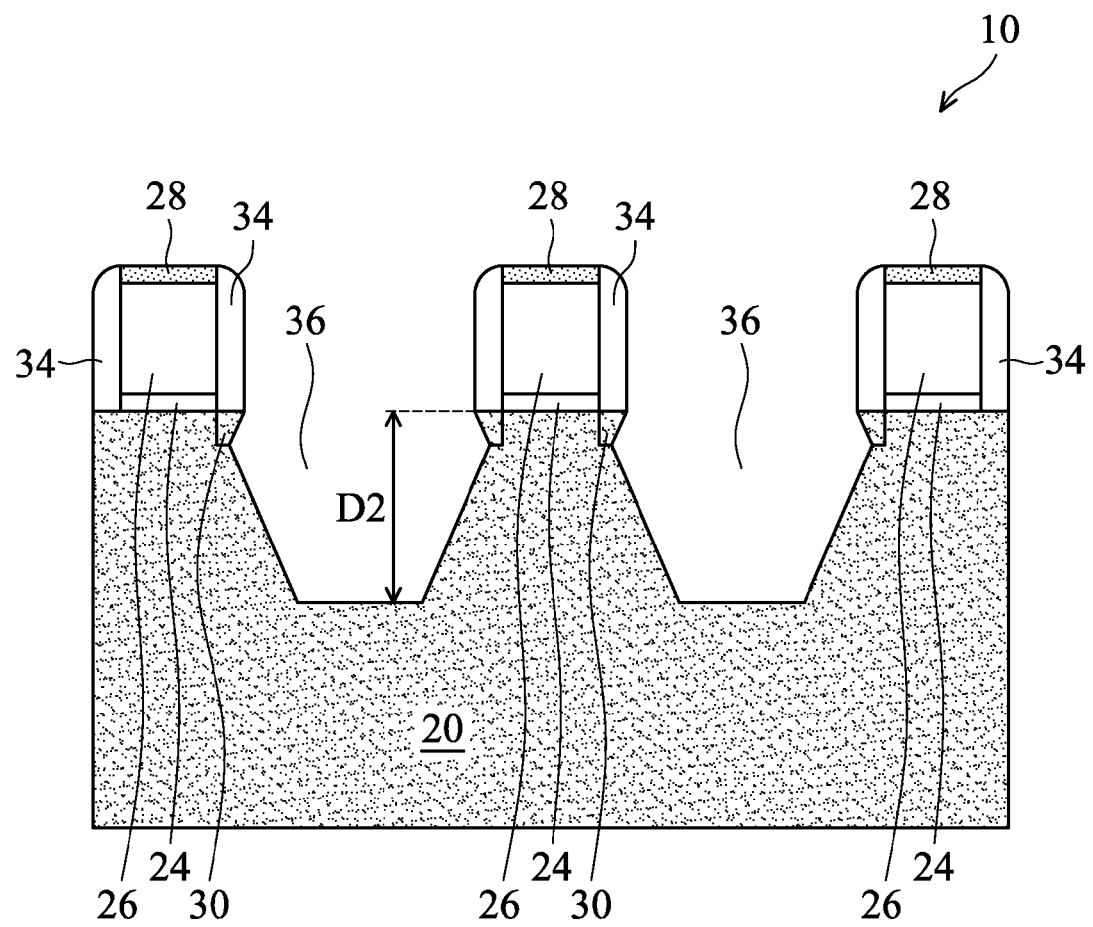

Next, as shown in FIG. 4, a wet etch is performed to expand openings 36. The wet etching may be performed, for example, using Tetra-Methyl Ammonium Hydroxide (TMAH), a potassium hydroxide (KOH) solution, or the like. In some exemplary embodiments, the TMAH solution has a concentration in a range between about 1 percent and about 30 percent. After the wet etching, facets may be formed in openings 36, which facets include (111) planes of substrate 20. In some exemplary embodiments, after the wet etching, depth D2 of openings 36 may be in a range between about 300 Å and about 800 Å, for example.

A pre-clean may be performed, for example, using an HF-based gas or a SiCoNi-based gas. The pre-clean may remove the silicon oxide that is formed as a result of the nature oxidation of the exposed surfaces in openings 36.

Figure 5:
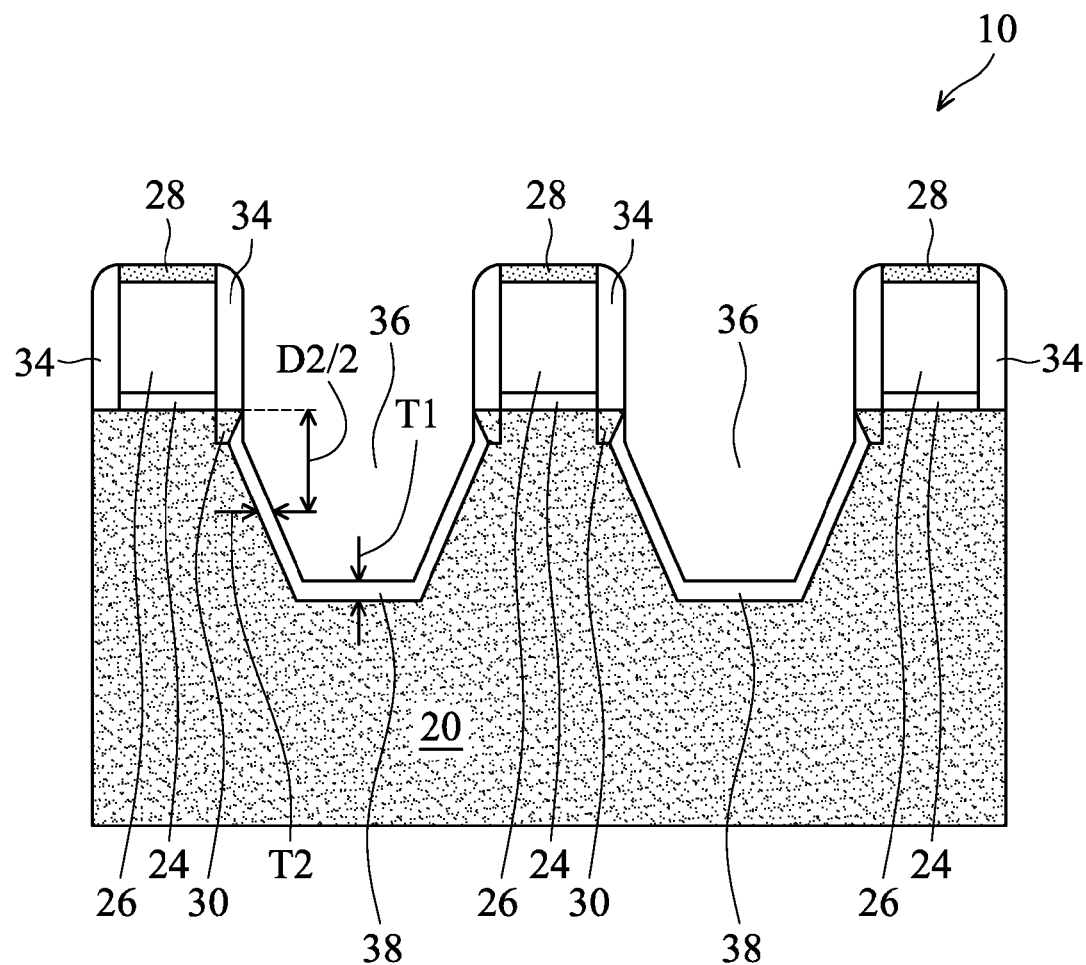

FIG. 5 illustrates the formation of Silicon Germanium (SiGe) layers 38, which are formed as thin layers. During the epitaxy, SiGe is epitaxially grown in openings 36 (FIG. 4) through Selective Epitaxial Growth (SEG), forming SiGe layers 38. The process gases may include $H_2$, $N_2$, dichlorosilane (DCS), $SiH_4$, $GeH_4$, and/or the like. The temperature of wafer 10 during the epitaxy may be in a range between about 600° C. and about 900° C. In some embodiments, an etching gas is added to promote the selective growth on the exposed surfaces of substrate 20, but not on dielectrics such as gate spacers 34 and hard masks 28. The pressure of the process gases may be in a range between about 10 torr and about 200 torr.

In some embodiments, during the epitaxy of SiGe layers 38, no p-type impurity is in-situ doped, or substantially no p-type impurity (for example, with a p-type impurity concentration lower than about $10^{14}/cm^3$) is doped. In alternative embodiments, during the epitaxy, p-type impurities are doped while the growth proceeds. For example, when boron is to be doped, $B_2H_6$ may be included in the process gases. The p-type impurities in SiGe layers 38 may be doped to a first p-type impurity concentration PC1 lower than about $1E20/cm^3$. SiGe layers 38 may have a first germanium atomic percentage GP1 in a range between about 10 percent and about 30 percent, for example, although different germanium percentages may also be used.

SiGe layers 38 are formed as thin layers. In some embodiments, thickness T1 of SiGe layers 38, which thickness is the thickness of the bottom portions of SiGe layers 38, is smaller than about 20 nm. Thickness T1 may also be in a range between about 5 nm and about 30 nm. Furthermore, distance T2 is between about 1 nm and about 20 nm. Distance T2 is the lateral distance between the left edge and the right edge of the sidewall portions of SiGe layers 38, wherein distance T2 is measured at a depth equal to D2/2, which is a half of the depth D2 of recess 36. Maintaining values T1 and T2 to be greater than certain values (for example, about 1 nm) may advantageously keep the subsequently formed germanium-rich layers 40 (FIG. 6) not to be too close to substrate 20. This in turn results in the reduction of the defects caused by the lattice mismatch between germanium-rich layers 40 and substrate 20. On the other hand, maintaining values T1 and T2 to be small enough, for example, smaller than about 20 nm, may maintain the benefit of reducing boron diffusion, as will be discussed subsequently.

Figure 6:
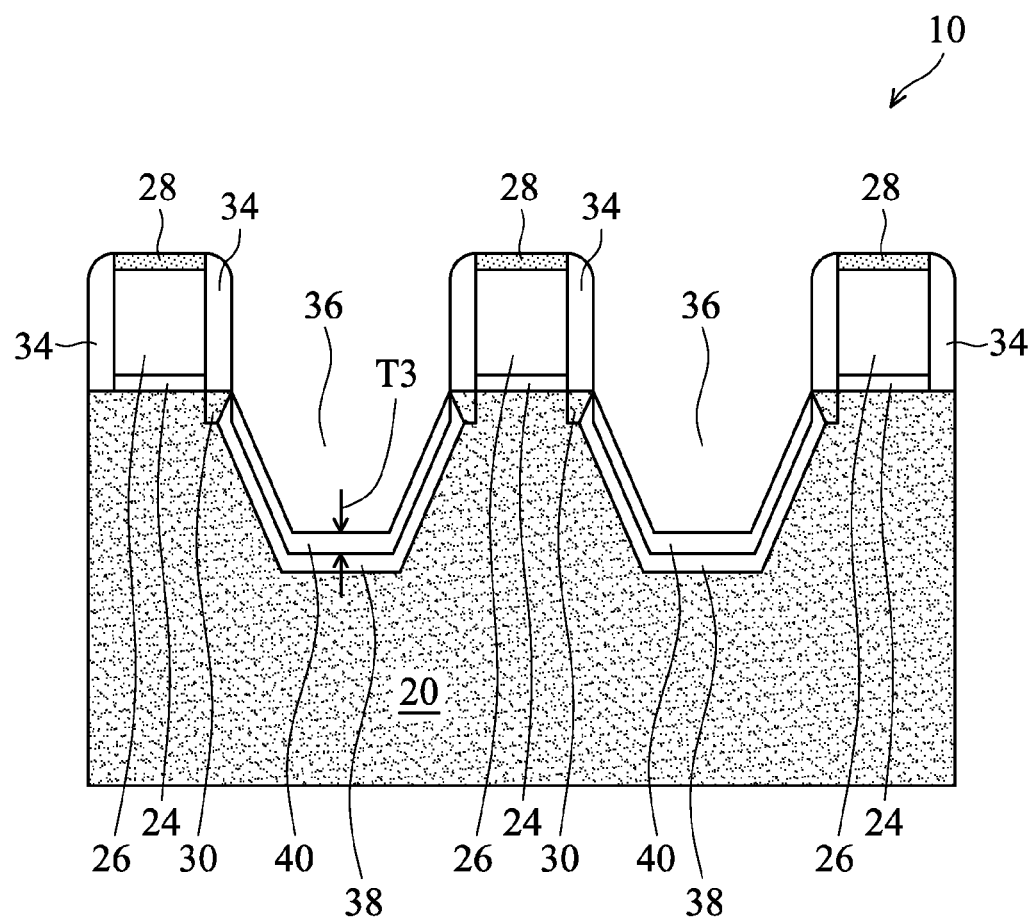

Referring to FIG. 6, epitaxy layers 40 are grown over SiGe layers 38 through an epitaxy process. In some embodiments, epitaxy layers 40 are SiGe layers, which have a germanium atomic percentage significantly higher than the germanium atomic percentage in SiGe layers 38. Throughout the description, epitaxy layers 40 are referred to as germanium-rich SiGe layers. When the epitaxy of germanium-rich SiGe layers 40 starts, the process conditions are adjusted, and the flow rate ratio of the flow rate of germanium-containing precursors (such as $GeH_4$) to the flow rate of silicon-containing precursors (such as $SiH_4$) is significantly increased. As a result, germanium-rich SiGe layers 40 have a second germanium atomic percentage GP2 significantly greater than germanium percentage GP1 in SiGe layers 38. In some exemplary embodiments, germanium atomic percentage GP2 is in a range between about 30 percent and about 60 percent. Germanium percentage difference (GP2−GP1) may be between about 10 percent and about 50 percent. Thickness T3 of germanium-rich SiGe layers 40 may be between about 1 nm and about 10 nm in some embodiments.

Furthermore, during the epitaxy for forming epitaxy regions 40, a p-type impurity may be in-situ doped with the proceeding of the epitaxy. The p-type impurity concentration in epitaxy regions 40 is greater than the p-type impurity concentration in SiGe layers 38. In some embodiments, ratio PIM40/PIM38, which is the ratio of p-type impurity concentration PIM40 in epitaxy regions 40 to p-type impurity concentration PIM38 in SiGe layers 38, is greater than about 3. Ratio PIM40/PIM38 may also be greater than about 2 in some embodiments.

Figure 7:
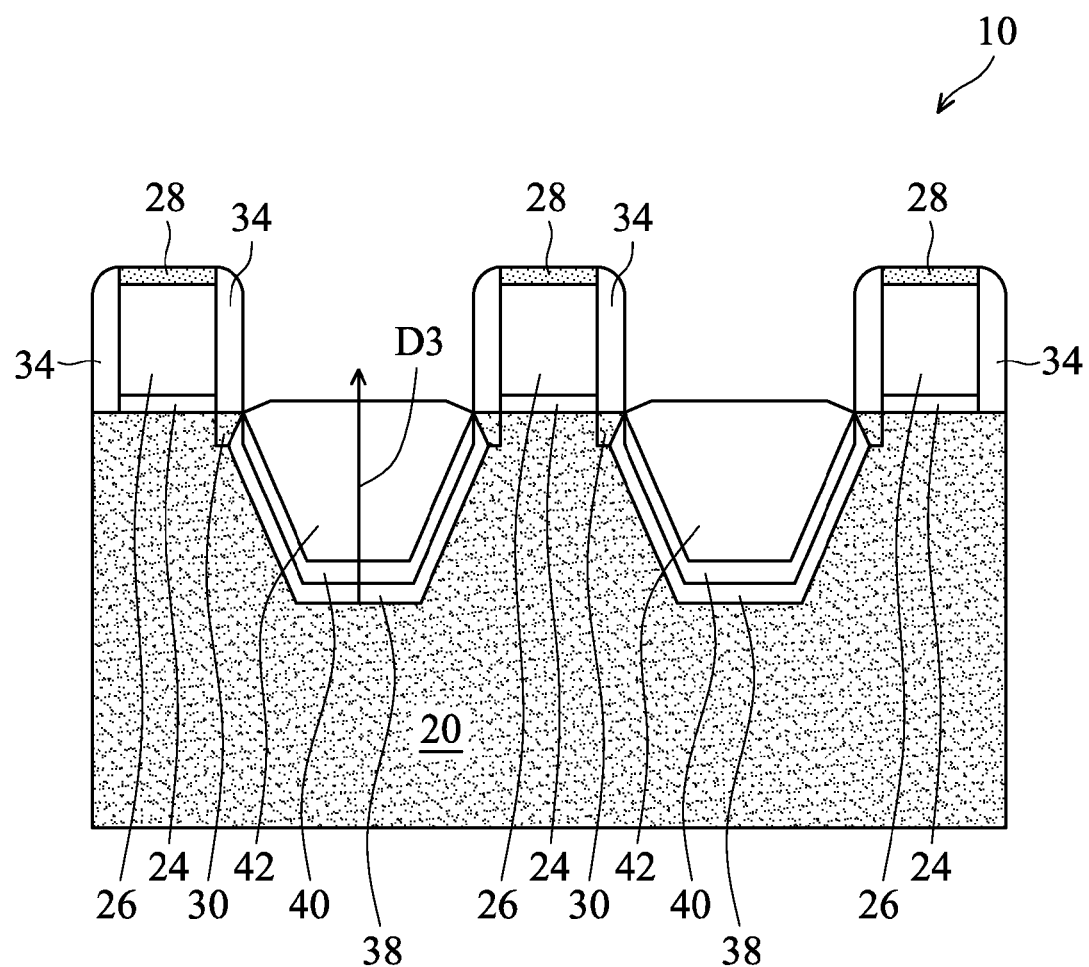

Referring to FIG. 7, epitaxy layers 42 are grown over epitaxy regions 40 through an epitaxy process. In some embodiments, epitaxy layers 42 are SiGe layers, which have a germanium atomic percentage GP3 significantly lower than the germanium atomic percentage GP2 in SiGe layers 40. Epitaxy layers 42 are referred to as SiGe layers 42 hereinafter. When the epitaxy of SiGe layers 42 starts, the process conditions are adjusted, and the flow rate ratio of the flow rate of germanium-containing precursors (such as $GeH_4$) to the flow rate of silicon-containing precursors (such as $SiH_4$) is significantly reduced. As a result, germanium atomic percentage GP3 in SiGe layers 42 is significantly lower than germanium percentage GP2 in epitaxy regions 40. In some exemplary embodiments, germanium atomic percentage GP3 is in a range between about 20 percent and about 50 percent. Germanium percentage difference (GP2−GP3) may be between about 10 percent and about 50 percent. The formation of epitaxy regions 42 finishes when the top surfaces of SiGe layers 42 are level with or higher than the interface between gate dielectric 24 and substrate 20.

During the epitaxy for forming epitaxy regions 42, a p-type impurity may be in-situ doped with the proceeding of the epitaxy. Furthermore, the p-type impurity concentration in epitaxy regions 42 is greater than the p-type impurity in SiGe layers 38. In some embodiments, the p-type impurity concentration PIM42 in epitaxy regions 42 and the p-type impurity concentration PIM38 in SiGe layers 38 have a ratio PIM42/PIM38, which is greater than about 3. Ratio PIM42/PIM38 may also be greater than about 2 in some embodiments.

In some embodiments, in each of SiGe layers 38 and 42, the germanium percentage as deposited is substantially uniform. In alternative embodiments, either one or both of SiGe layers 38 and 42 has gradually and continuously changed germanium percentages. During the respective epitaxy, the flow rate of the germanium-containing precursor (such as GeH$_4$) may be gradually and continuously changed. In these embodiments, in the layer in which the germanium percentages gradually change, the lower portions of the layer have germanium percentages lower than the germanium percentages of the upper portions, the resulting germanium profile in regions 38 and 42 may be similar to what are shown in FIG. 12.

Figure 12:
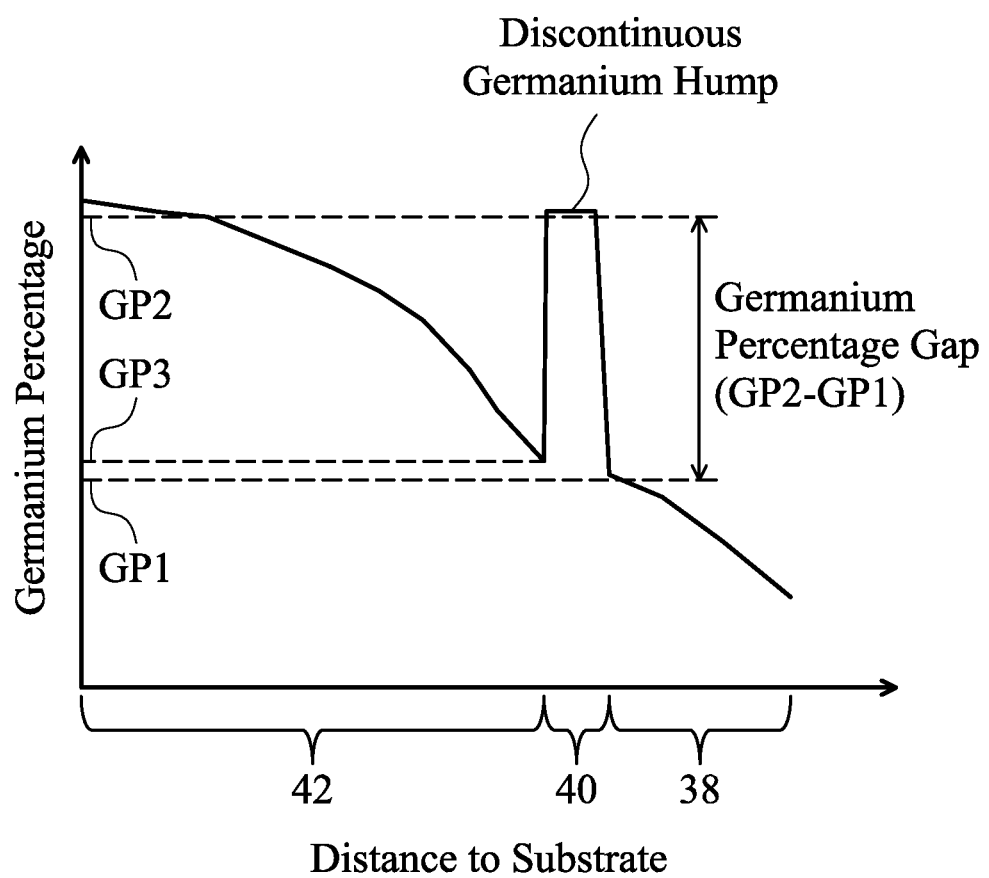
FIG. 12 schematically illustrates an exemplary profile of germanium percentages in the epitaxy regions of the MOS device in accordance with some embodiments.

FIG. 12 schematically illustrates germanium percentages in SiGe layers 38, 40, and 42 as functions of the vertical distance from the respective regions to the top surface of substrate 20. The vertical distance is marked as D3 in FIG. 7. Regions 38, 40, and 42 and the respective germanium concentrations GP1, GP2, and GP3 are marked in FIG. 12. FIG. 12 illustrates that regions 38 and 42 have continuously increased germanium percentages, and a germanium percentage hump is generated in region 40 due to the abrupt increase in the germanium percentage from GP1 to GP2 and the abrupt reduction from GP2 to GP3.

Figure 8:
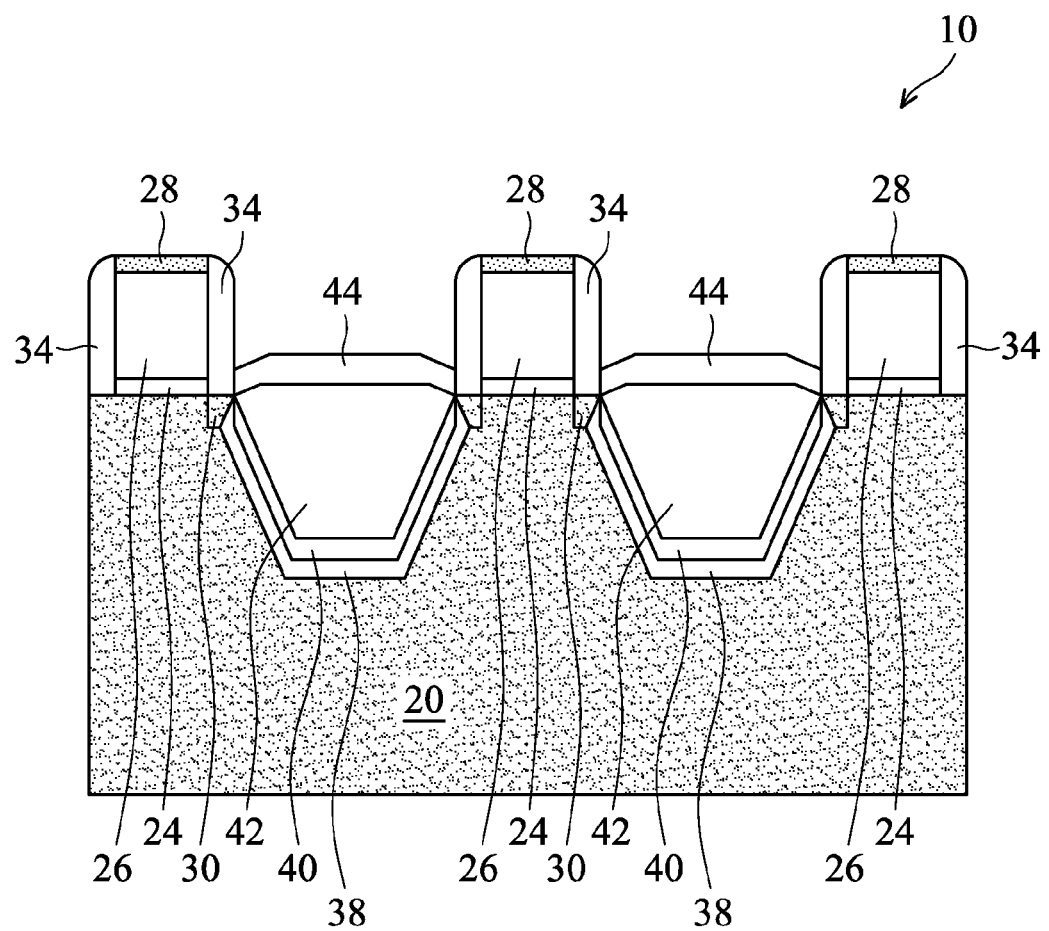

After the formation of SiGe regions 42, capping layers 44 are formed over SiGe regions 42 through epitaxy, as shown in FIG. 8. Capping layers 44 may have a composition (including the elements contained therein and the percentages of the elements) different from the composition of SiGe regions 42. Capping layers 44 may be pure silicon layers with no germanium comprised therein, or substantially pure silicon layers with, for example, less than 2 percent, or 1 percent, germanium. Accordingly, capping layers 44 are alternatively referred to as silicon caps throughout the description. Capping layers 44 may be in-situ doped with p-type impurities with the proceeding of the epitaxy, or not in-situ doped. In the embodiments that no p-type impurity or substantially no p-type impurity is doped during the epitaxy of SiGe layers 38, 42, and/or capping layers 44, a p-type impurity implantation may be performed to form source and drain regions for the respective MOS device.

Figure 9:
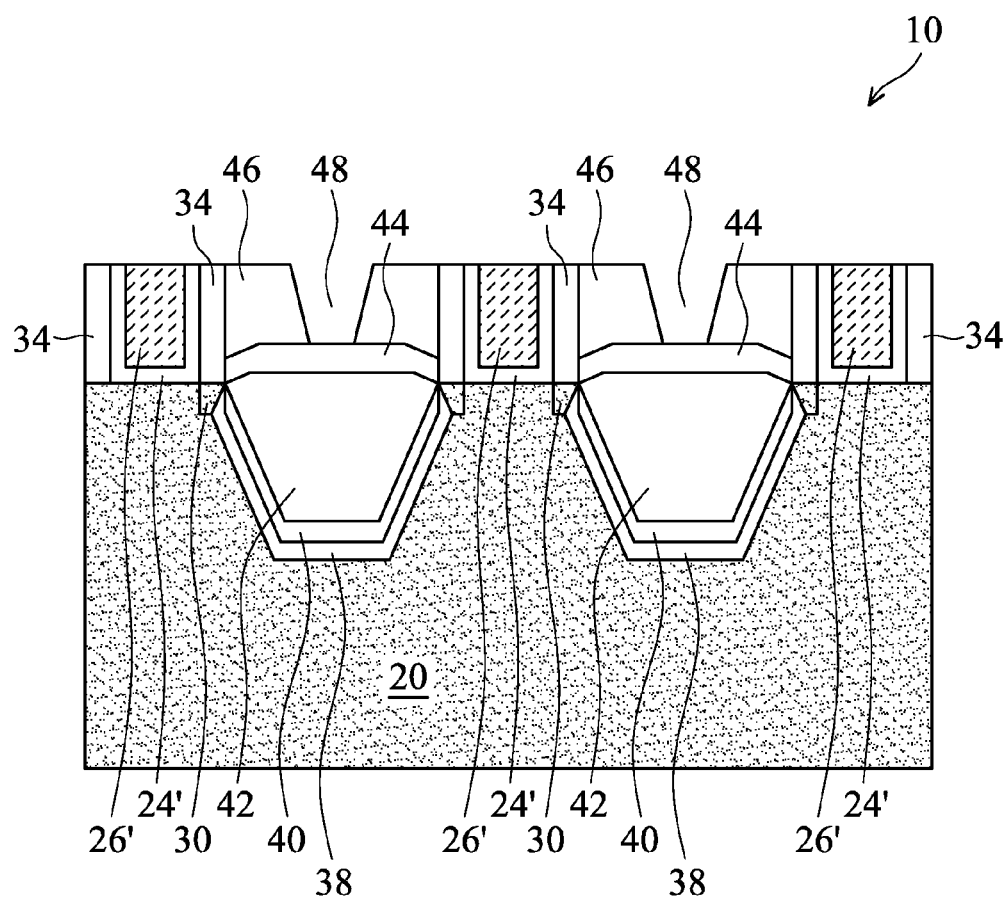

Next, referring to FIG. 9, hard masks 28 (refer to FIG. 8), if any, are removed, and replacement gates are formed to replace gate dielectrics 24 and gate electrodes 26 in accordance with some embodiments. In alternative embodiments, gate dielectrics 24 and gate electrodes 26 are not replaced with replacement gates. In the embodiments replacement gates are formed, gate dielectrics 24 and gate electrodes 26 (FIG. 8) act as dummy gates that are removed. FIG. 9 illustrates an exemplary structure including the replacement gates. The formation process may include forming Inter-Layer Dielectric (ILD) 46, performing a CMP to level the top surfaces of ILD 46 with the top surface of gate electrodes 26 (or hard mask 28, if any), and removing the dummy gates. A gate dielectric layer and a gate electrode layer may then be formed to fill the openings left by the removed dummy gates, followed by a CMP to remove excess portions of the gate dielectric layer and the gate electrode layer. The remaining replacement gates include gate dielectrics 24' and gate electrodes 26'. Gate dielectrics 24' may comprise a high-k dielectric material with a k value greater than about 7.0, for example, and gate electrodes 26' may comprise a metal or a metal alloy. ILD 46 may be formed of a dielectric material such as Phospho-Silicate Glass (PSG), Boro-Silicate Glass (BSG), Boron-Doped Phospho-Silicate Glass (BPSG), or the like. Next, contact openings 48 are formed, exposing underlying capping layers 44.

Figure 10:
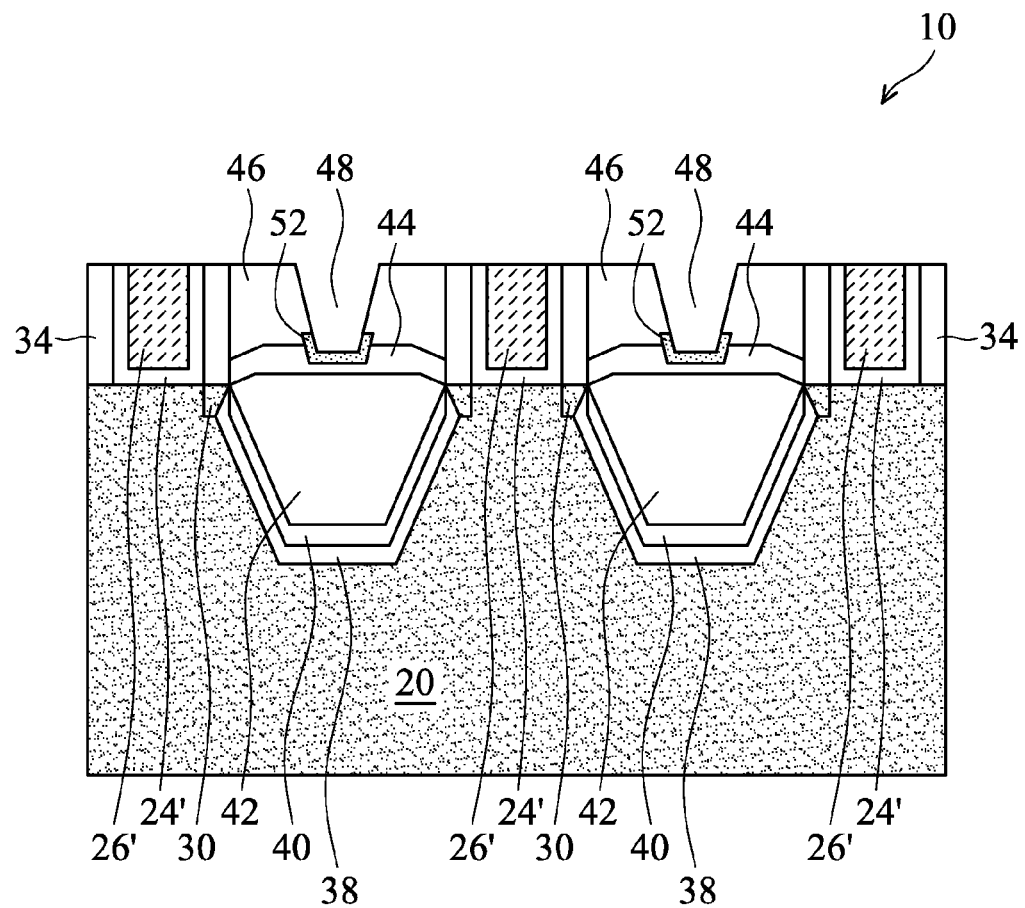

FIG. 10 illustrates the formation of source/drain silicide regions 52. Silicide regions 52 may be formed by depositing a thin layer (not shown) of a silicide metal, such as titanium, cobalt, nickel, tungsten, or the like, over the devices, including the exposed surfaces of capping layers 44. A anneal is then performed to react the metal with silicon/germanium. After the reaction, a layer of metal silicide is formed between silicon and the metal. The un-reacted metal is selectively removed through the use of an etchant that attacks the metal but does not attack silicide. As a result of the silicidation, source/drain silicide regions 52 extend into capping layers 44, and may extend into SiGe layers 42. Alternatively, the top portions of capping layers 44 are silicided, and the bottom portions of capping layers 44 are not silicided. After the silicidation, there may be some remaining portions of capping layers 44 remaining not silicided, wherein the remaining portions 44 are level with, and are on the opposite sides of, source/drain silicide regions 52.

Figure 11:
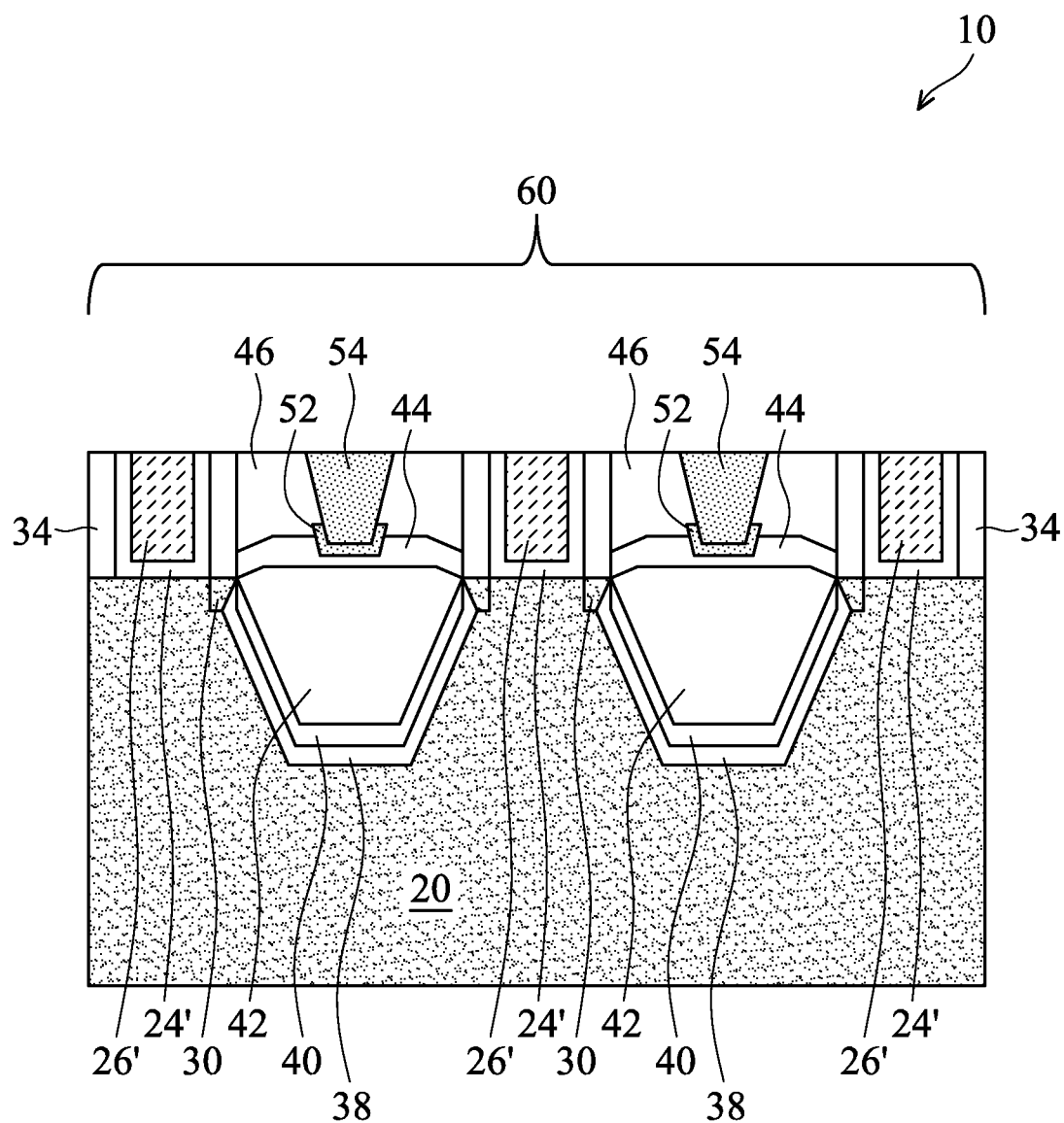

FIG. 11 illustrates the formation of source/drain contact plugs 54, which are formed by filling a conductive material such as tungsten, copper, aluminum, titanium, cobalt, silicon, germanium, and/or the like, into openings 48, and performing a CMP to level the top surface of contact plugs 54 with the top surface of ILD 46. MOS transistor 60 is thus formed, which includes epitaxy layers 38, 40, 42, and possibly the remaining portions of capping layers 44 as the source and drain regions.

The embodiments of the present disclosure have some advantageous features. High germanium regions have good ability for preventing the diffusion of boron. Therefore, by forming germanium-rich SiGe layers adjacent to the substrate, the boron diffusion from the source/drain regions of the MOS device to the substrate may be retarded by germanium-rich SiGe layers. The germanium-rich SiGe layers and the SiGe regions above may thus have high-boron concentrations without the concern of having too much boron diffused in to channels. Since a thin layer of SiGe with a low germanium percentage is inserted between each of the germanium-rich SiGe layers and the substrate, the defects caused by lattice mismatch between the germanium-rich SiGe layers and the substrate is minimized.

In accordance with some embodiments, an integrated circuit structure includes a gate stack over a semiconductor substrate, and an opening extending into the semiconductor substrate, wherein the opening is adjacent to the gate stack. A first silicon germanium region is in the opening, wherein the first silicon germanium region has a first germanium percentage. A second silicon germanium region is over the first silicon germanium region, wherein the second silicon germanium region has a second germanium percentage higher than the first germanium percentage. A third silicon germanium region is over the second silicon germanium region, wherein the third silicon germanium region has a third germanium percentage lower than the second germanium percentage.

In accordance with other embodiments, an integrated circuit structure includes a semiconductor substrate, a gate stack over the semiconductor substrate, wherein the gate stack is comprised in a MOS device, and a source/drain region of the MOS device extending into the semiconductor substrate. The source/drain region includes a first silicon germanium layer, a second silicon germanium layer over the first silicon germanium layer, and a third silicon germanium layer over the second silicon germanium layer. The first silicon germanium layer has a first germanium percentage. The second silicon germanium layer has a second germanium percentage greater than the first germanium percentage by about 10 percent. The third silicon germanium layer has a third germanium percentage lower than the second germanium percentage by about 10 percent. A metal silicide region is over and electrically coupled to the third silicon germanium layer.

In accordance with yet other embodiments, a method includes forming a gate stack over a semiconductor substrate, and forming an opening extending into the semiconductor substrate, wherein the opening is on a side of the gate stack. A first epitaxy is performed to grow a first silicon germanium layer in the opening, wherein the first silicon germanium layer has a first germanium percentage. A second epitaxy is performed to grow a second silicon germanium layer over the first silicon germanium layer, wherein the second silicon germanium layer has a second germanium percentage higher than the first germanium percentage. A third epitaxy is performed to grow a third silicon germanium layer over the second silicon germanium layer, wherein the third silicon germanium layer has a third germanium percentage lower than the second germanium percentage.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a semiconductor substrate;
   a gate stack over the semiconductor substrate;
   an opening extending into the semiconductor substrate, wherein the opening is adjacent to the gate stack;
   a first silicon germanium region in the opening, the first silicon germanium region extending over a bottom surface and along sidewalls of the opening, and further extending to a top surface of the semiconductor substrate proximate the gate stack, and wherein the first silicon germanium region has a first germanium percentage;
   a second silicon germanium region over the first silicon germanium region, wherein the second silicon germanium region has a second germanium percentage higher than the first germanium percentage; and
   a third silicon germanium region over the second silicon germanium region, wherein the third silicon germanium region has a third germanium percentage, the third germanium percentage being lower than the second germanium percentage at an interface of the second silicon germanium region and the third silicon germanium region, wherein each of the first and the third silicon germanium regions has a continuously increased germanium percentage, with higher portions of each of the first and the third silicon germanium regions having germanium percentages higher than germanium percentages in respective lower portions.

2. The integrated circuit structure of claim 1 further comprising a silicon cap substantially free from germanium over the third silicon germanium region.

3. The integrated circuit structure of claim 2 further comprising a metal silicide region over and in contact with the silicon cap.

4. The integrated circuit structure of claim 1 further comprising a Metal-Oxide-Semiconductor (MOS) device, wherein the first silicon germanium region, the second silicon germanium region, and the third silicon germanium region comprise a source/drain region of the MOS device.

5. The integrated circuit structure of claim 1, wherein a depth of the opening is in a range between about 300 Angstroms to about 800 Angstroms.

6. The integrated circuit structure of claim 1, wherein a thickness of the first silicon germanium region over the bottom surface of the opening is in a range from about 5 nm to about 30 nm, wherein a thickness of the first silicon germanium region along sidewalls of the opening is in a range from about 1 nm to about 20 nm.

7. The integrated circuit structure of claim 1, wherein a thickness of the second silicon germanium region is in a range from about 1 nm to about 10 nm.

8. The integrated circuit structure of claim 1, wherein the second germanium percentage of the second silicon germanium region is constant.

9. The integrated circuit structure of claim 8, wherein the third germanium percentage is equal to or larger than the second germanium percentage at a top portion of the third silicon germanium region.

10. An integrated circuit structure comprising:
    a semiconductor substrate;
    a gate stack over the semiconductor substrate, wherein the gate stack is comprised in a Metal-Oxide-Semiconductor (MOS) device;
    a source/drain region of the MOS device extending into a recess of the semiconductor substrate, wherein the source/drain region comprises:
      a first silicon germanium layer, the first silicon germanium layer extending from a bottom of the recess to a top of the recess, and wherein the first silicon germanium layer has a first germanium percentage;
      a second silicon germanium layer over the first silicon germanium layer, wherein the second silicon germanium layer has a second germanium percentage greater than the first germanium percentage; and
      a third silicon germanium layer over the second silicon germanium layer, wherein the third silicon germanium layer has a third germanium percentage lower than the second germanium percentage, wherein each of the first and the third silicon germanium layers has a continuously increased germanium percentage, with higher portions of each of the first and the third silicon germanium layers having germanium percentages higher than germanium percentages in respective lower portions; and
    a metal silicide region over and electrically coupled to the third silicon germanium layer.

11. The integrated circuit structure of claim 10, wherein the first and the second silicon germanium layers are lower than an interface between the semiconductor substrate and the gate stack.

12. The integrated circuit structure of claim 10, wherein the second germanium percentage is greater than the first germanium percentage by a difference in a range between about 10 percent and about 50 percent.

13. The integrated circuit structure of claim 10, wherein at an interface between the first silicon germanium layer and the second silicon germanium layer, there is an abrupt increase from the first germanium percentage to the second germanium percentage.

14. The integrated circuit structure of claim 10, wherein at an interface between the second silicon germanium layer and the third silicon germanium layer, there is an abrupt decrease from the second germanium percentage to the third germanium percentage.

15. The integrated circuit structure of claim 10, wherein the first silicon germanium layer has a thickness between about 1 nm and about 10 nm.

16. The integrated circuit structure of claim 10, wherein the second silicon germanium layer has a thickness between about 1 nm and about 10 nm.

17. The integrated circuit structure of claim 10, wherein each of the first and the second silicon germanium layers further comprises a p-type impurity, and wherein a ratio of p-type impurity concentration in the second silicon germanium layer to p-type impurity concentration in the first silicon germanium layer is greater than about 2.

18. The integrated circuit structure of claim 10, wherein each of the first and the third silicon germanium layers further comprises a p-type impurity, and wherein a ratio of p-type impurity concentration in the third silicon germanium layer to p-type impurity concentration in the first silicon germanium layer is greater than about 2.

19. An integrated circuit structure comprising:
  a gate stack over a top surface of a substrate;
  a source/drain region adjacent to the gate stack, wherein the source/drain region extends from the top surface of the substrate into the substrate, wherein the source/drain region comprises:
    a first silicon germanium layer with a first germanium percentage, wherein the first germanium percentage continuously increases along a bottom-to-top direction such that a higher portion of the first silicon germanium layer has a higher germanium percentage than that of a lower portion of the first silicon germanium layer;
    a second silicon germanium layer over the first silicon germanium layer, wherein the second silicon germanium layer has a second germanium percentage higher than the first germanium percentage, wherein the second germanium percentage is constant, wherein at an interface of the first silicon germanium layer and the second silicon germanium layer, there is an abrupt increase from the first germanium percentage to the second germanium percentage; and
    a third silicon germanium layer over the second silicon germanium layer, wherein the third silicon germanium layer has a third germanium percentage, wherein at an interface of the second silicon germanium layer and the third silicon germanium layer, there is an abrupt decrease from the second germanium percentage to the third germanium percentage, and wherein the third germanium percentage continuously increases along the bottom-to-top direction; and
  a metal silicide layer over and electrically coupled to the third silicon germanium layer.

* * * * *

UNITED STATES PATENT AND TRADEMARK OFFICE
CERTIFICATE OF CORRECTION

PATENT NO. : 9,337,337 B2
APPLICATION NO. : 13/968751
DATED : May 10, 2016
INVENTOR(S) : Kwok et al.

It is certified that error appears in the above-identified patent and that said Letters Patent is hereby corrected as shown below:

On the Title Page, Item (72) Inventors, line 3, delete "Khubei (TW);" and insert --Zhubei (TW);--.

Signed and Sealed this
Ninth Day of August, 2016

Michelle K. Lee
*Director of the United States Patent and Trademark Office*